(12) United States Patent
Farooq et al.

(10) Patent No.: US 9,105,517 B2
(45) Date of Patent: Aug. 11, 2015

(54) WAFER TO WAFER ALIGNMENT BY LED/LSD DEVICES

(71) Applicant: International Business Machines Corporation, Armonk, NY (US)

(72) Inventors: Mukta G. Farooq, Hopewell Junction, NY (US); John A. Fitzsimmons, Poughkeepsie, NY (US); Spyridon Skordas, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 80 days.

(21) Appl. No.: 14/025,119

(22) Filed: Sep. 12, 2013

(65) Prior Publication Data

US 2015/0069421 A1    Mar. 12, 2015

(51) Int. Cl.
*H01L 21/66* (2006.01)
*H01L 25/16* (2006.01)
*H01L 21/68* (2006.01)

(52) U.S. Cl.
CPC .............. *H01L 22/12* (2013.01); *H01L 21/68* (2013.01); *H01L 25/167* (2013.01)

(58) Field of Classification Search
CPC ........ H01L 22/12; H01L 21/68; H01L 21/681
See application file for complete search history.

(56) References Cited

U.S. PATENT DOCUMENTS

| | | | |
|---|---|---|---|
| 6,952,255 B2 * | 10/2005 | Perry et al. | 356/141.2 |
| 6,963,061 B2 | 11/2005 | Richard et al. | |
| 7,737,515 B2 | 6/2010 | Ravindra et al. | |
| 8,004,289 B2 | 8/2011 | Dalton et al. | |
| 8,259,539 B1 | 9/2012 | Hu et al. | |

(Continued)

FOREIGN PATENT DOCUMENTS

KR    1020120129490 A    11/2012

OTHER PUBLICATIONS

Lee et al., "Wafer-to-Wafer Alignment for Three-Dimensional Integration: A Review", Journal of Microelectromechanical Systems, vol. 20, No. 4, Aug. 2011, pp. 885-898.*

(Continued)

*Primary Examiner* — William F Kraig
*Assistant Examiner* — Sun M Kim
(74) *Attorney, Agent, or Firm* — Howard M. Cohn; H. Daniel Schnurmann

(57) ABSTRACT

A method for wafer alignment includes forming a first alignment circuit within a first semiconductor wafer; the first alignment circuit is configured to emit an optical signal. Next, the first alignment circuit is activated upon receiving a first activation signal from a wafer bonding tool then the optical signal is sent to a second alignment circuit in a second semiconductor wafer in overlapping relation to the first semiconductor wafer. The second alignment circuit transmits a second activation signal to the wafer bonding tool and consequently the wafer bonding tool initiates an alignment technique between the first and second semiconductor wafers. The alignment technique uses the first and second alignment circuits for optical alignment.

15 Claims, 5 Drawing Sheets

(56) References Cited

U.S. PATENT DOCUMENTS

| | | |
|---|---|---|
| 2009/0130821 A1 | 5/2009 | Cox et al. |
| 2009/0289265 A1* | 11/2009 | Roozeboom et al. ........... 257/80 |
| 2011/0129948 A1 | 6/2011 | Hsieh et al. |
| 2011/0220925 A1 | 9/2011 | Greenwood |
| 2012/0050732 A1 | 3/2012 | Lu et al. |
| 2012/0074417 A1 | 3/2012 | Nunan et al. |
| 2012/0083099 A1 | 4/2012 | Nuzzo et al. |
| 2012/0084022 A1 | 4/2012 | Giovangrandi et al. |
| 2012/0086021 A1 | 4/2012 | Wang |
| 2012/0223440 A1 | 9/2012 | Fujita |

OTHER PUBLICATIONS

Ming-Fei Chen,; Yu-Sen Ho; Shen-Mao Wang,"A fast positioning method with pattern tracking for automatic wafer alignment" Image and Signal Processing (CISP), 2010 3rd International Congress on vol. 4, Publication Year: 2010, pp. 1594-1598 Digital Object Identifier: 10.1109/CISP.2010.5647710.

* cited by examiner

US 9,105,517 B2

WAFER TO WAFER ALIGNMENT BY LED/LSD DEVICES

BACKGROUND

The present invention generally relates to wafer alignment for wafer bonding in 3-dimensional (3D) integration processes, and more particularly, to wafer-to-wafer alignment using light emitting diode (LED) and light sensing diode (LSD) devices.

Wafer bonding is a technology used in microelectronics fabrication, in which a first semiconductor wafer having first chip structures may be aligned with second chip structures on a surface of a second semiconductor wafer for fabricating an electronic circuit. The contact may be arranged in such a way that signals may be transported from at least one first chip structure on the first semiconductor wafer to at least one second chip structure on the second semiconductor wafer and vice versa. This arrangement is often referred to as a 3D wafer alignment.

Typically, wafer-to-wafer alignment for wafer bonding may be accomplished through complicated alignment techniques that rely on geometric transpositions of passive structures that represent geometric coordinates on one wafer such that a minimization of an alignment error may be accommodated through external measurement analysis and feedback instrumentation. Such instrumentation relies on optical measurement and detection sensors that predominantly operate in the infrared (IR) or near IR range of the electromagnetic spectrum.

Multiple sources of error may be inherent in this range of the electromagnetic spectrum, such as: refraction of image signal due to possible non-optical linearity of the substrate, opacity of substrate due to metal masking layers, intrinsic error in accuracy due to IR wavelength, etc. As semiconductor technology continues the trend of miniaturization, high-precision wafer-to-wafer alignment becomes increasingly important for 3D integration processes.

SUMMARY

According to one embodiment of the present disclosure, a method for wafer alignment, includes: forming a first alignment circuit within a first semiconductor wafer, the first alignment circuit configured to emit an optical signal, activating the first alignment circuit upon receiving a first activation signal from a wafer bonding tool, sending the optical signal to a second alignment circuit in a second semiconductor wafer in overlapping relation to the first semiconductor wafer, the second alignment circuit transmitting a second activation signal to the wafer bonding tool and the wafer bonding tool initiating an alignment technique between the first and second semiconductor wafers, the alignment technique using the first and second alignment circuit for optical alignment.

According to another embodiment of the present disclosure, a method for wafer alignment, includes: forming a first optical device within a first semiconductor wafer, the first optical device configured to emit an optical signal, forming a first antenna within the first semiconductor wafer, the first antenna configured to receive a first activation signal, forming a first discriminator circuit within the first semiconductor wafer, the first discriminator circuit communicating with the first antenna for detecting the first activation signal and activating the first optical device upon receiving the first activation signal, forming a second optical device within a second semiconductor wafer, the second optical device configured to receive an optical signal from the first semiconductor wafer and transmit a second activation signal upon receiving the optical signal, forming a second antenna within the second semiconductor wafer, the second antenna configured to transmit the second activation signal, forming a second discriminator circuit within the second semiconductor wafer, the second discriminator circuit communicating with the second antenna for emitting a second activation signal and initiating an alignment technique between the first and second semiconductor wafers using the first and second optical devices.

According to another embodiment of the present disclosure, a wafer alignment structure includes: a first alignment circuit located within a first semiconductor wafer including a first optical device connected to a first antenna positioned within a back-end-of-the-line region of the first semiconductor wafer and to a first discriminator circuit positioned within a front-end-of-the-line region of the first semiconductor wafer, the first semiconductor wafer being located within a first bonding chuck of a wafer bonding tool and a second alignment circuit located within a second semiconductor wafer including a second optical device connected to a second antenna positioned within a back-end-of-the-line region of the second semiconductor wafer and to a second discriminator circuit positioned within a front-end-of-the-line region of the second semiconductor wafer, the second semiconductor wafer being positioned within a second bonding chuck of a wafer bonding tool.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Exemplary embodiments now will be described more fully herein with reference to the accompanying drawings, in which exemplary embodiments are shown. This invention may, however, be modified in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessary obscuring the presented embodiments.

One method of wafer-to-wafer alignment is described in detail below by referring to the accompanying drawings in FIGS. 1-4, in accordance with an illustrative embodiment of the present disclosure.

Figure 1:
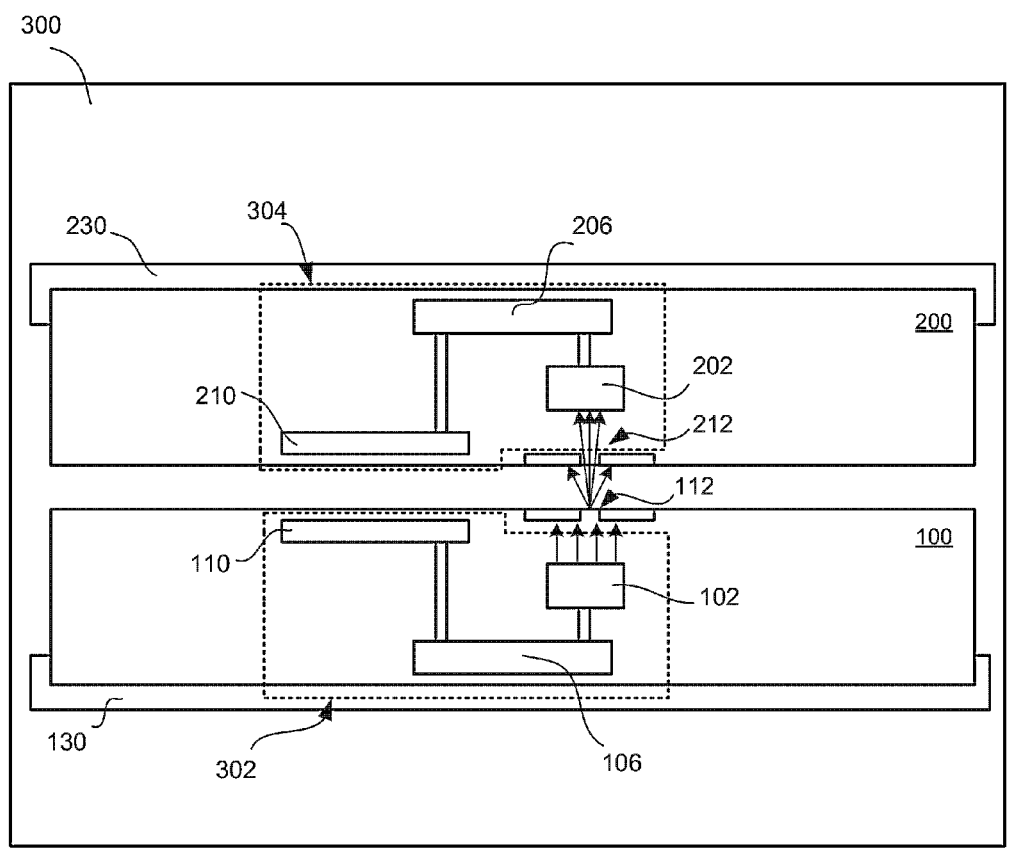
FIG. 1 is a cross-sectional view of two semiconductor wafers including alignment circuits depicting an alignment state between the two semiconductor wafers, according to an embodiment of the present disclosure.

FIG. 1 is a cross-sectional view of two semiconductor wafers 100 and 200 positioned within a wafer bonding tool 300, each wafer having an alignment circuit, according to an embodiment of the present disclosure. More specifically, FIG. 1 depicts a cross-sectional view of a first semiconductor wafer 100 located within a first bonding chuck 130 of the wafer bonding tool 300 and a second semiconductor wafer 200 positioned within a second bonding chuck 230 of the same wafer bonding tool 300. The second bonding chuck 230 containing the second semiconductor wafer 200 may be located on top of the first bonding chuck 130 containing the first semiconductor wafer 100.

It should be noted that a top surface of the semiconductor wafer 200 is positioned such that it is directly opposite from a top surface of the semiconductor wafer 100.

With continued reference to FIG. 1, the first semiconductor wafer 100 may include a first alignment circuit 302. The first alignment circuit 302 may include a first antenna 110 formed within a back-end-of-the-line (BEOL) region of the first semiconductor wafer 100 for receiving a first activation signal. The first antenna 110 may be electrically connected to a first discriminator circuit 106. The first discriminator circuit 106 may be formed within a front-end-of-the-line (FEOL) region of the first semiconductor wafer 100. The first antenna 110 may communicate the first activation signal to the first discriminator circuit 106 to activate a first optical device 102 located within the first alignment circuit 302. The first optical device 102 may be electrically connected to the first discriminator circuit 106 and the first antenna 110. In an embodiment of the present disclosure, the first optical device 102 may include a light emitting diode (LED) device.

According to the configuration of the first alignment circuit 302 described above, the first optical device 102 (hereafter referred to as "LED device") may be remotely activated to begin emitting the optical signal from the first semiconductor wafer 100. The activation process including: the first antenna 110 detecting the first activation signal originated in the wafer bonding tool 300, and then communicating the first activation signal to the first discriminator circuit 106 which in turn may activate the LED device 102. In another embodiment of the present disclosure, the LED device 102 may be activated by connecting the alignment circuit 302 to a wired circuit formed within the semiconductor wafer 100.

The LED device 102 may be positioned within the same area as the first antenna 110 to preserve area within the first semiconductor wafer 100.

With continued reference to FIG. 1, the second semiconductor wafer 200 may include a second alignment circuit 304. The second alignment circuit 304 may include a second antenna 210 located within a back-end-of-the-line (BEOL) region of the second semiconductor wafer 200 for transmitting a second activation signal. The second antenna 210 may be electrically connected to a second discriminator circuit 206. The second discriminator circuit 206 may be formed within a front-end-of-the-line (FEOL) region of the second semiconductor wafer 200. A second optical device 202 may be formed within the second alignment circuit 304. The second optical device 202 may be electrically connected to the second discriminator circuit 206 and the second antenna 210. In an embodiment of the present disclosure, the second optical device 202 may include a light sensing diode (LSD) device. The second discriminator circuit 206 may detect a second activation signal, also referred to as a current signal, sent from the second optical device 202 (hereafter referred to as "LSD device") and transmit the second activation signal through the second antenna 210 to an external structure (not shown) located in the wafer bonding tool 300.

The LSD device 202 may also be positioned within the same area as the second antenna 210 to preserve area within the second semiconductor wafer 200.

It should be noted that the semiconductor wafers 100 and 200 may have multiple alignment circuits 302 and 304 used to achieve varying degrees of accuracy as will be described in detail below.

In an embodiment of the present disclosure, the configuration of the first alignment circuit 302 and the second alignment circuit 304, may allow for the functioning of either optical device as an LED device or an LSD device by assigning the desired function through the discriminator circuits 106 and 206. This feature may allow redundancy within the alignment circuits which may be functional in the case of having defective optical devices. In this embodiment, the alignment circuits 302 and 304 may include substantially similar alignment circuits including optical devices configured as LED devices 102 or LSD devices 202 within the first semiconductor wafer 100 and the second semiconductor wafer 200.

The first alignment circuit 302 and the second alignment circuit 304 may be positioned in a kerf area of the first semiconductor wafer 100 and the second semiconductor wafer 200, respectively. The kerf area, also referred to as a dicing channel, is an area between chip structures located on a semiconductor wafer as described below in FIG. 2.

With continued reference to FIG. 1, according to an embodiment of the present disclosure, the semiconductor wafers 100 and 200 may include first pinhole 112 and second pinhole 212, respectively. The first pinhole 112 may be formed above the first alignment circuit 302 while the second pinhole 212 may be formed above the second alignment circuit 304. In an embodiment of the present disclosure, the first and second pinholes 112, 212 may be formed by selective patterning and metallization. The patterning and metallization of pinholes 112, 212 may be conducted simultaneously with the formation of ordinary metal levels for an integrated circuit structure.

It should be noted that pinholes of different diameter may be positioned above a single alignment circuit. Depending on the diameter of the pinholes 112, 212, a course or a fine alignment may be achieved. Multiple alignment circuits per wafer may have different pinhole diameter to achieve different levels of accuracy. Further, alignment circuits with different pinhole diameter may be used during an alignment procedure to identify misalignment direction and applying the corresponding corrections.

The diameter of the pinholes 112, 212 may be calibrated to form pinholes with gradated diameter (hereafter referred to as "gradated pinholes"). The optical signal may be transmitted from the first alignment circuit 302 in the first semiconductor wafer 100 to the second alignment circuit 304 to the second semiconductor wafer 200 through the first and second gradated pinholes 112 and 212. The diameter of the gradated pinholes 112, 212 may correspond to the accuracy or tolerance of the desired alignment between wafers.

With continued reference to FIG. 1, the second semiconductor wafer 200 is shown in a state of complete alignment with the first semiconductor wafer 100. In 3D integration processes, if two wafers are substantially aligned then they may be bonded together. In one embodiment, when the two semiconductor wafers 100 and 200 may be substantially aligned, the optical signal received by the LSD device 202 may be maximum. Next a second activation signal containing an alignment information may be transmitted from the LSD device 202 through the second discriminator circuit 206 to the second antenna 210. The second antenna 210 may communicate the alignment information to the wafer bonding tool 300 to start a wafer bonding process.

Figure 2:
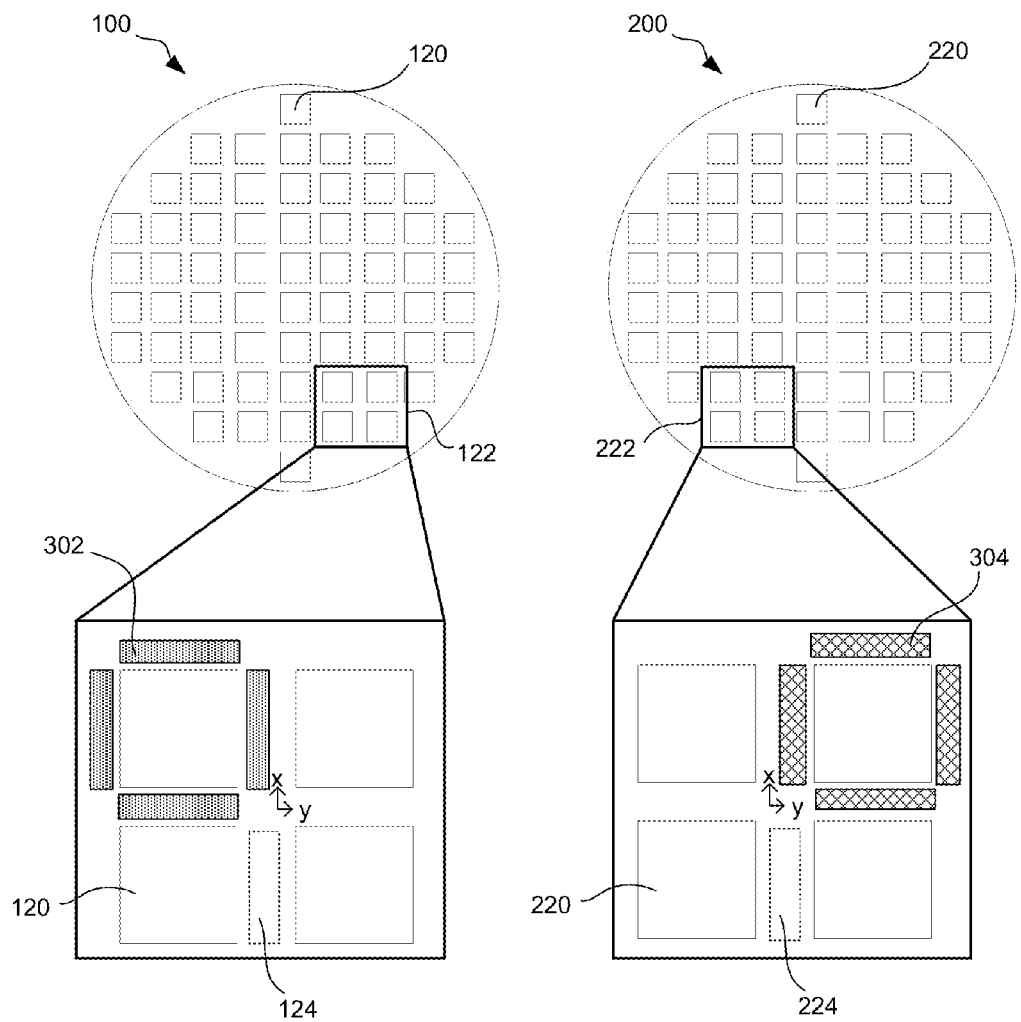
FIG. 2 is a top view of two semiconductor wafers depicting a location for the alignment circuits within a surface of the semiconductor wafers, according to an embodiment of the present disclosure.
Figure 3:
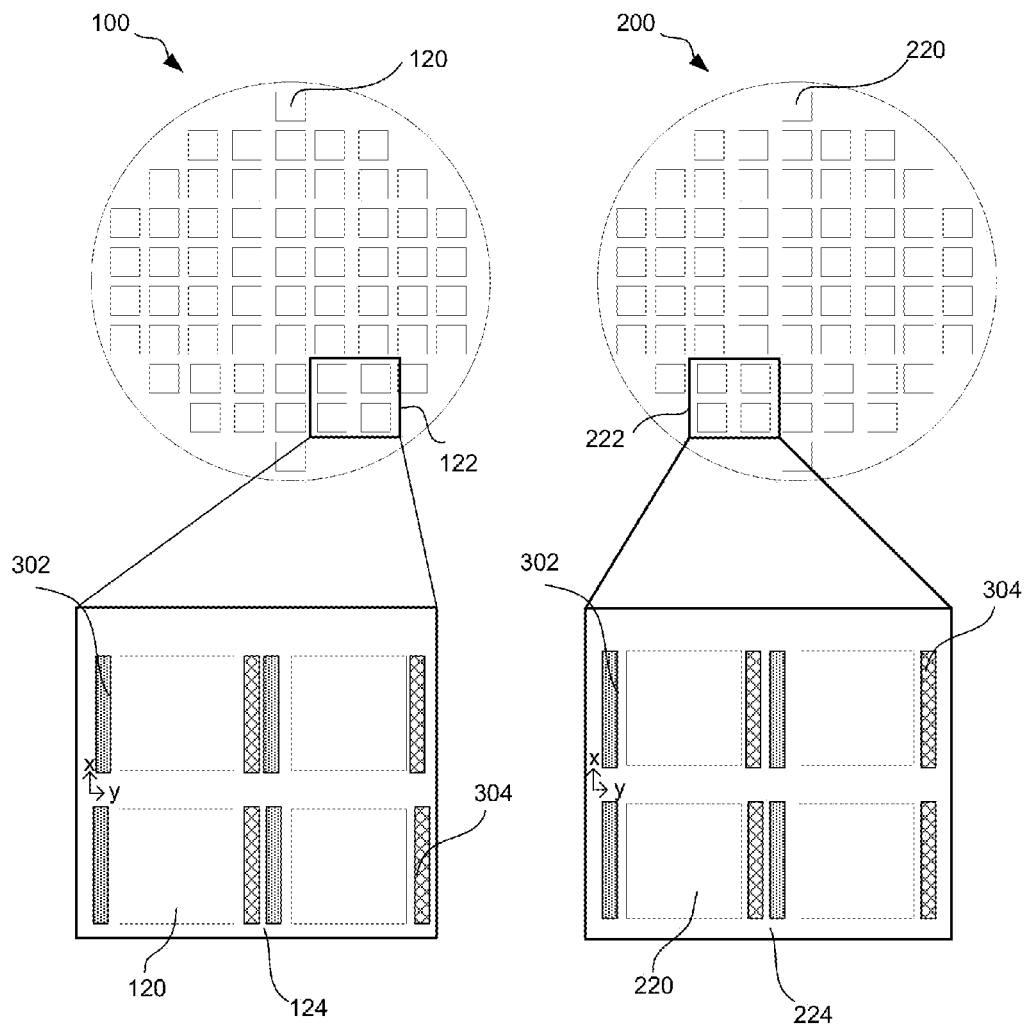
FIG. 3 is a top view of two semiconductor wafers depicting an alternate location for the alignment circuits within the surface of the semiconductor wafers, according to an embodiment of the present disclosure.

It should be noted that although only one alignment circuit per wafer is depicted in FIG. 1, several alignment circuits may be positioned within the first and second semiconductor wafers 100, 200 as shown in FIGS. 2-3 below.

FIG. 2 depicts top views of the first semiconductor wafer 100 and the second semiconductor wafer 200. In this embodiment, the first semiconductor wafer 100 may include a plurality of chip structures 120 distributed within a surface of the first semiconductor wafer 100 according to a specific design. A section view of an area 122 of the first semiconductor wafer 100 depicts a possible location of the first alignment circuit 302. The first alignment circuit 302 may be located in the kerf area 124 of the semiconductor wafer 100 around each of the chip structures 120. However, the alignment circuit 302 may be located in the kerf area between any of the chip structures 120.

Similarly, the second semiconductor wafer 200 may include a plurality of chip structures 220 distributed within the surface of the second semiconductor wafer 200. A section view of an area 222 of the second semiconductor wafer 200 depicts a possible location of the second alignment circuit 304. The second alignment circuit 304 may be located in the kerf area 224 of the second semiconductor wafer 200 around each of the chip structures 220. As shown in FIG. 2, the distribution of the second alignment circuit 304 within the second semiconductor wafer 200 may be performed in a way such that for every first alignment circuit 302 within the first semiconductor wafer 100 there is a corresponding second alignment circuit 304 within the second semiconductor wafer 200.

In one embodiment of the present disclosure, the alignment circuit distribution shown in FIG. 2 includes positioning a first alignment circuit 302 in the kerf area between the chip structures 120 within the first semiconductor wafer 100 and positioning a second alignment circuit 304 in the kerf area between the chip structures 220 within the second semiconductor wafer 200. This distribution may minimize global wafer-to-wafer misalignment on a chip-to-chip alignment level. Alternatively, in another embodiment of the present disclosure, the first and second alignment circuits 302 and 304 may be formed in the kerf area of a predetermined region of the first and second semiconductor wafers 100 and 200.

In another embodiment, the alignment circuits 302, 304 may be located within a chip structure or in an edge area of each semiconductor wafer.

FIG. 3 shows an alternate configuration for positioning the alignment circuits 302 and 304 within the first and second semiconductor wafers 100 and 200. In an embodiment of the present disclosure, a hybrid distribution may be considered. The hybrid distribution may include uniformly distributing both types of alignment circuits containing LED emitters and LSD receivers within the first semiconductor wafer 100 and the second semiconductor wafer 200.

A detailed view of area 122 illustrates a possible hybrid distribution within the first semiconductor wafer 100. Similarly, a detailed view of area 222 illustrates a possible hybrid distribution within the second semiconductor wafer 200. In an embodiment of the present disclosure, for every first alignment circuit 302 there is a corresponding second alignment circuit 304 within the opposite semiconductor wafer. Each semiconductor wafer may have a combination of LED and LSD devices assigned to each chip structure uniquely.

In one embodiment, not all the kerf areas 124, 224 around the chip structures 122, 222 may include an alignment circuit as shown in FIG. 3. An example of hybrid configurations where only a portion of the chip structures may have alignment circuits include: a cross, a spiral and other geometric shapes (not shown). In another embodiment, the alignment circuits 302 and 304 may be positioned within the chip structures or in an edge area of each semiconductor wafer.

In some embodiments, conventional alignment marks (not shown) may exist in the first semiconductor wafer 100 and the second semiconductor wafer 200. The presence of the alignment marks typically used in wafer alignment may facilitate an initial coarse alignment of the first and second semiconductor wafers 100, 200.

Figure 4:
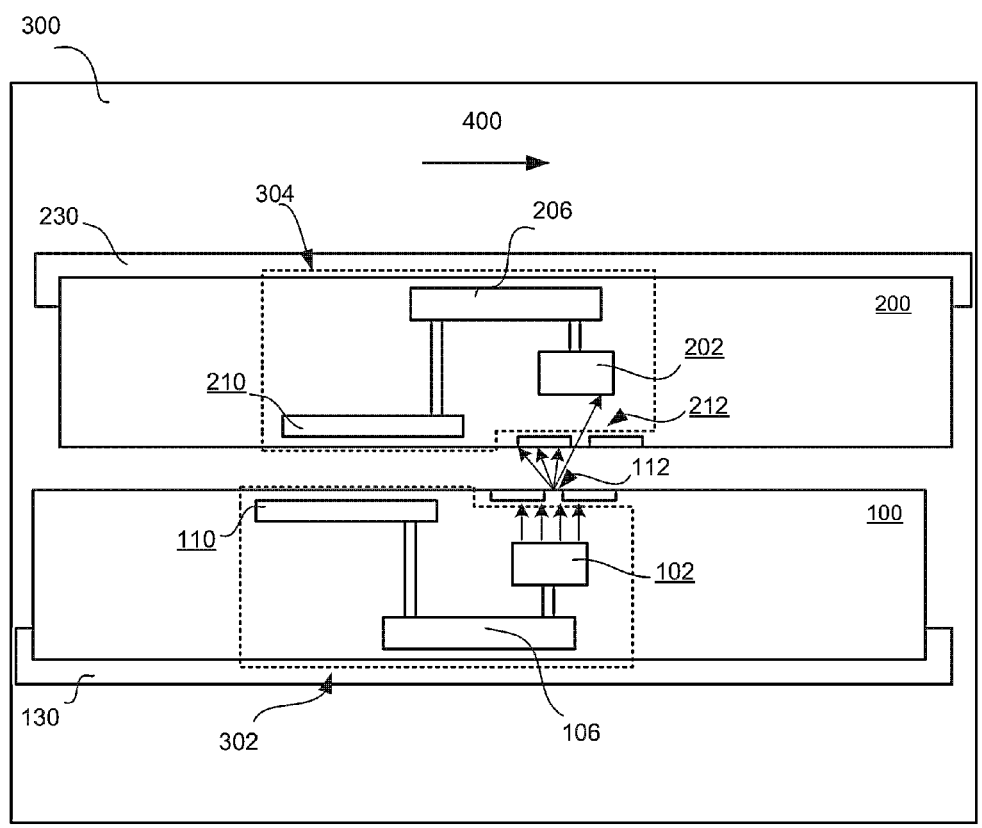
FIG. 4 is a cross-sectional view of two semiconductor wafers including alignment circuits depicting a misalignment state between the two semiconductor wafers, according to an embodiment of the present disclosure.

FIG. 4 depicts a misalignment state between the first semiconductor wafer 100 and the second semiconductor wafer 200. More particularly, FIG. 4 shows the first and the second semiconductor wafers 100 and 200 after the second semiconductor wafer 200 moves with respect to the first semiconductor wafer 100 in the direction of arrow 400. Alternatively, the second semiconductor wafer 200 may also be moved in the opposite direction of arrow 400. The direction of arrow 400 may be essentially parallel to the first and second semiconductor wafers 100 and 200.

In the misalignment state, the optical signal, represented by arrows in FIG. 4, may be deviated from a pathway provided by the second gradated pinhole 212. In this case, a weakened optical signal may be detected by the LSD device 202 indicating that further adjustments may be needed to improve alignment between the first semiconductor wafer 100 and the second semiconductor wafer 200. In consequence, the LSD device 202 may transmit the second activation signal through the second antenna 210 to an external structure (not shown) positioned in the wafer bonding tool 300 to initiate an alignment technique between the first and second semiconductor wafers. The second activation signal may contain information regarding a current alignment state between the first semiconductor wafer 100 and the second semiconductor wafer 200. Once the second activation signal is transmitted to the alignment tool, the alignment information is analyzed and the position of the first and the second bonding chucks containing the first and second semiconductor wafers 100 and 200 is adjusted until the optical signal detected by the LSD device 202 is maximized.

According to the diameter of the second gradated pinhole 212, a fine alignment or a coarse alignment may be performed. The course alignment may include gradated pinholes with a bigger diameter while the fine alignment may include gradated pinholes with a smaller diameter. In the coarse alignment case, second gradated pinholes 212 having a bigger diameter may provide a wider pathway for the optical signal to pass and be detected by the LSD device 202. In this embodiment, the LSD device 202 may detect a stronger optical signal with less position adjustments between the first and second semiconductor wafers 100 and 200. However, the first and second semiconductor wafers 100 and 200 may not be completely aligned.

In the fine alignment case, second gradated pinhole 212 having a smaller diameter may provide a narrower pathway for the optical signal to pass and be detected by the LSD device 202, hence further position adjustments between the first and second semiconductors wafers 100 and 200 may be needed to obtain a stronger optical signal, this in turn may present better accuracy for aligning the first and second semiconductor wafers 100 and 200.

It should be noted that although only one alignment circuit per semiconductor wafer is depicted in FIG. 4, several alignment circuits may be positioned within the first and second semiconductor wafers 100, 200 as shown in FIGS. 2-3 above.

Figure 5:
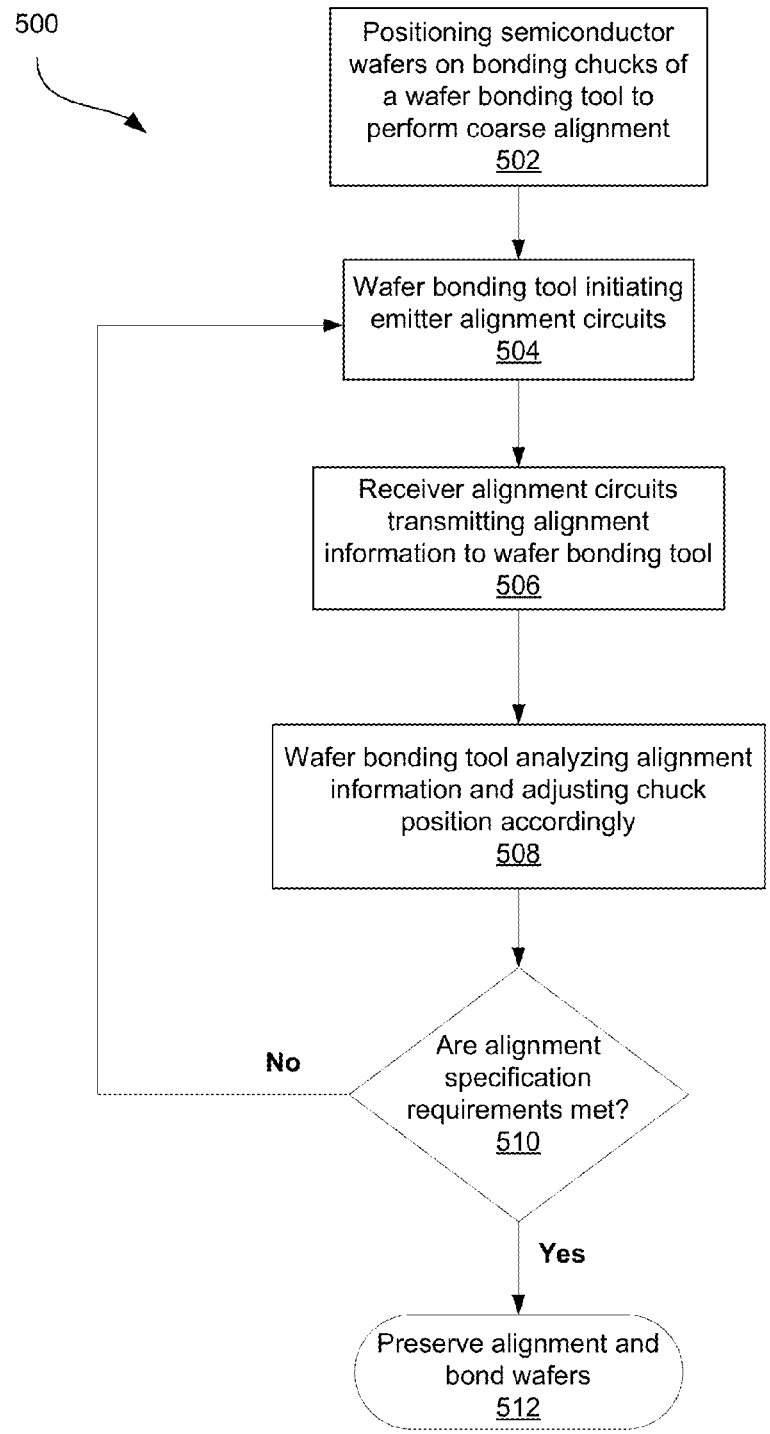
FIG. 5 is a flow chart depicting a method for the fabrication of alignment circuits within a semiconductor wafer, according to an embodiment of the present disclosure.

FIG. 5 is a flowchart indicating process steps for an embodiment of the present disclosure. In process step 502, the first and second semiconductor wafers 100, 200 may be inserted within the corresponding bonding chuck of the wafer bonding tool 300 (as shown in FIG. 1). In process step 504 the bonding tool 300 may send an activation signal detected by the first antenna 110 to activate the LED device 102 and begin emitting an optical signal. In process step 506 the LSD device may receive the optical signal and transmit an electrical signal with the alignment information through the second antenna 210 to an external structure located in the wafer bonding tool 300. In processing step 508, the wafer bonding tool 300 may analyze the received alignment information and then adjust the position of the bonding chucks containing the semiconductor wafers accordingly. In process step 510 a check may be performed to determine if the alignment specifications are met. If the alignment may be considered correct, then the process may end and the wafers may be bonded. If the alignment may not be considered correct, then another signal containing new alignment correction data may be transmitted to the first antenna 110 to repeat the alignment process from process step 504. Depending on the embodiment, the first semiconductor wafer 100, the second semiconductor wafer 200 or both may be adjusted in response to the alignment correction data determined in process step 508. Process steps 504-510 may be repeated numerous times in an iterative manner until the semiconductor wafers are determined to be aligned.

The method described above may provide an alternate approach to traditional wafer alignment techniques. According to embodiments of the present disclosure, the need for external infrared alignment and alignment markers may be eliminated by using alignment circuits containing LED and LSD devices. The use of active and passive devices such as LED devices and LSD devices may enable self-alignment of the semiconductor wafers with respect to each other. This in turn may eliminate the need for bonding chuck calibrations. Additionally, the unique use of LED and LSD devices on a chip-level may minimize measurement error and may enable an advanced and more accurate alignment during wafer-to-wafer-bonding.

It may be noted that not all advantages of the present invention are include above. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method for wafer alignment, comprising:
    forming a first alignment circuit within a first semiconductor wafer, the first alignment circuit configured to emit an optical signal;
    activating the first alignment circuit upon receiving a first activation signal from a wafer bonding tool;
    sending the optical signal to a second alignment circuit in a second semiconductor wafer in overlapping relation to the first semiconductor wafer, the second alignment circuit transmitting a second activation signal to the wafer bonding tool; and
    the wafer bonding tool initiating an alignment technique between the first and second semiconductor wafers, the alignment technique using the first and second alignment circuit for optical alignment.

2. The method of claim 1, wherein forming the first alignment circuit comprises forming a first antenna, a first discriminator circuit and a first optical device within the first semiconductor wafer.

3. The method of claim 2, wherein forming the first optical device comprises configuring a light emitting diode (LED) device.

4. The method of claim 1, wherein forming the second alignment circuit comprises forming a second antenna, a second discriminator circuit and a second optical device within the first semiconductor wafer.

5. The method of claim 4, wherein forming the second optical device comprises configuring a light sensing diode (LSD) device.

6. A method for wafer alignment, comprising:
    forming a first optical device within a first semiconductor wafer, the first optical device configured to emit an optical signal;
    forming a first antenna within the first semiconductor wafer, the first antenna configured to receive a first activation signal;
    forming a first discriminator circuit within the first semiconductor wafer, the first discriminator circuit communicating with the first antenna for detecting the first activation signal and activating the first optical device upon receiving the first activation signal;
    forming a second optical device within a second semiconductor wafer, the second optical device configured to receive an optical signal from the first semiconductor wafer and transmit a second activation signal upon receiving the optical signal;
    forming a second antenna within the second semiconductor wafer, the second antenna configured to transmit the second activation signal;
    forming a second discriminator circuit within the second semiconductor wafer, the second discriminator circuit communicating with the second antenna for emitting a second activation signal; and
    initiating an alignment technique between the first and second semiconductor wafers using the first and second optical devices.

7. The method of claim 6, wherein forming the first antenna and the second antenna comprises positioning the first antenna and the second antenna within a back-end-of-the-line region of the first semiconductor wafer and the second semiconductor wafer respectively.

8. The method of claim 6, wherein forming the first discriminator circuit and the second discriminator circuit comprises positioning the first discriminator circuit and the second discriminator circuit within a front-end-of-the-line region of the first semiconductor wafer and the second semiconductor wafer respectively.

9. The method of claim 6, wherein forming the first optical device comprises configuring a LED device.

10. The method of claim 6, wherein forming the second optical device comprises configuring a light sensing diode LSD device.

11. The method of claim 6, wherein forming the first optical device and the second optical device comprises forming a corresponding second optical device within the second semiconductor wafer for every first optical device formed within the first semiconductor wafer.

12. The method of claim 6, further comprising:
forming a first pinhole above the first optical device in the first semiconductor wafer, the first pinhole having gradated diameter to form a first gradated pinhole providing a pathway for transmitting the optical signal; and
forming a second pinhole above the second optical device in the second semiconductor wafer, the second pinhole having gradated diameter to form a second gradated pinhole providing a pathway for receiving the optical signal.

13. The method of claim 12, wherein forming the first and second pinhole comprises forming pinholes of different diameter in each semiconductor wafer to perform a coarse or a fine alignment.

14. The method of claim 12, wherein the first and second pinholes providing a pathway for transmitting or receiving the optical signal comprises the diameter of the first and second pinhole being directly related to alignment accuracy.

15. The method of claim 6, further comprising:
positioning the first semiconductor wafer within a first bonding chuck of a wafer bonding tool;
positioning the second semiconductor wafer within a second bonding chuck of the wafer bonding tool;
transmitting the second activation signal from the second optical device to an external structure located in the wafer bonding tool, the second activation signal indicates a present alignment between the first semiconductor wafer and the second semiconductor wafer; and
adjusting the position of the first bonding chuck relative to the second bonding chuck to maximize the optical signal received by the second optical device in the second semiconductor wafer, wherein the first semiconductor wafer and the second semiconductor wafer are aligned when the optical signal received by the second optical device is maximized.

* * * * *